(12) United States Patent
Fujita et al.

(10) Patent No.: US 6,215,159 B1
(45) Date of Patent: Apr. 10, 2001

(54) SEMICONDUCTOR INTEGRATED CIRCUIT DEVICE

(75) Inventors: Tetsuya Fujita, Kawasaki; Gensoh Matsubara, Bunkyo-ku; Tadahiro Kuroda, Yokohama; Takayasu Sakurai, Setagaya-ku, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/046,980

(22) Filed: Mar. 24, 1998

(30) Foreign Application Priority Data

Mar. 26, 1997 (JP) ...................................... 9-073873

(51) Int. Cl.[7] .............................. H01L 29/76; G05F 1/10
(52) U.S. Cl. ........................................... 257/369; 327/544
(58) Field of Search ............................ 365/226; 327/534, 327/537, 530, 544; 257/369

(56) References Cited

U.S. PATENT DOCUMENTS 6,016,281 * 1/2000 Brrox ............................... 365/230.06
6,034,563 * 3/2000 Mashiko ............................... 327/544

OTHER PUBLICATIONS

Mutoh et al., "A 1–V Multi–Threshold Voltage CMOS DSP with an Efficient Power Management Technique for Mobile Phone Applications," IEEE International Solid State Circuits Conference, pp. 168–169, 438, 1996.*

Shigematsu, Satoshi, et al. "A 1–V High–speed MTCMOS Circuit Scheme for Power–Down Applications," 1995 Symposium on VLSI Circuits Digest of Technical Papers, Jun. 1995, pp. 125–126.

* cited by examiner

Primary Examiner—Trung Dang
Assistant Examiner—Brook Kebede
(74) Attorney, Agent, or Firm—Hogan & Hartson, LLP.

(57) ABSTRACT

CMOS logic circuit CM is of a structure in which the threshold value of constituent transistors MP1, MN1, etc. thereof is set to value lower than ordinary value, and the threshold value of a stand-by state current control P-channel MOS transistor MP2 is set to value higher than the threshold value of the transistors MP1, MN1, etc. constituting the CMOS logic circuit CM. A level conversion circuit 10 outputs a signal in which low level indicates negative voltage and high level indicates the same potential VDD as that of the first power supply line P1 in dependency upon high level and low level of signal applied to control input terminal SIG to thereby carry out ON/OFF control of the P-channel MOS transistor MP2. Accordingly, lower voltage of 0V or less, or higher voltage of VDD or more is applied to the gate of the stand-by state current control MOS transistor in the CMOS logic circuit, whereby even if the power supply voltage VDD is caused to be low voltage, ON/OFF operation of the stand-by state current control MOS transistor is securely carried out.

3 Claims, 13 Drawing Sheets

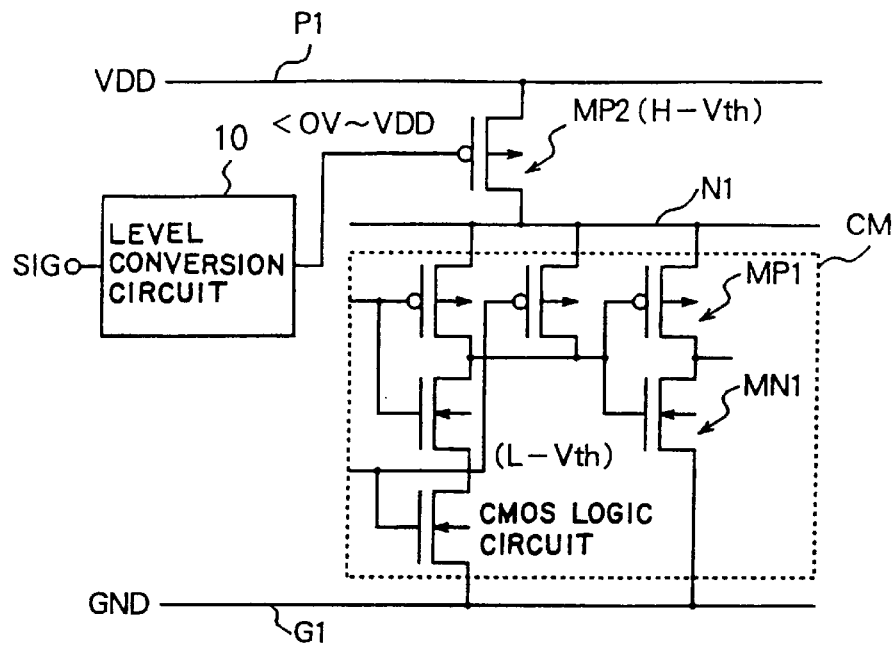
1-ST ENBODIMENT
OF THIS INVENTION
F I G. 1
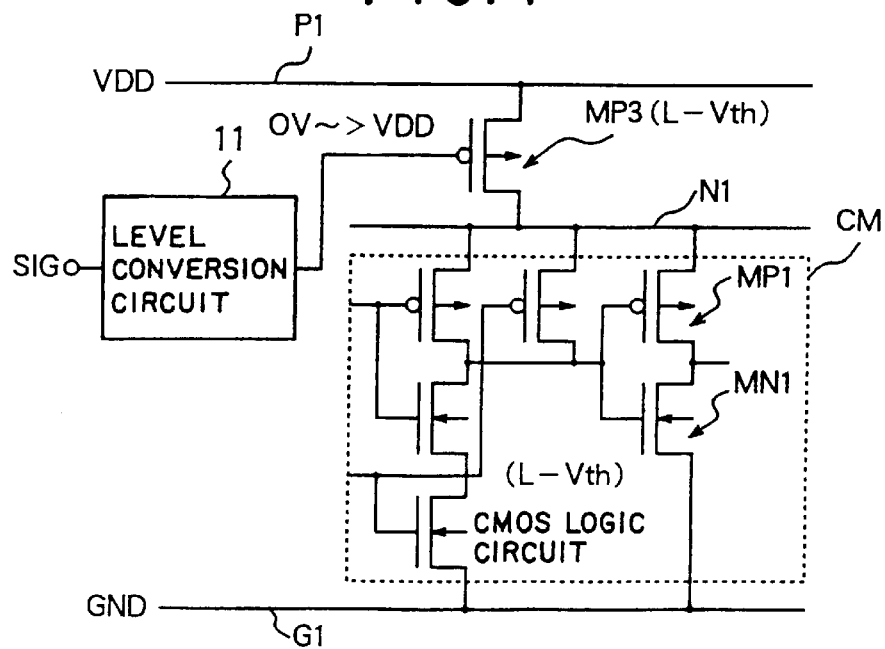
2-ND ENBODIMENT
OF THIS INVENTION
F I G. 2

3-RD ENBODIMENT
OF THIS INVENTION

4-TH ENBODIMENT
OF THIS INVENTION

LEVEL CONVERSION CIRCUIT (1)

LEVEL CONVERSION CIRCUIT (2)

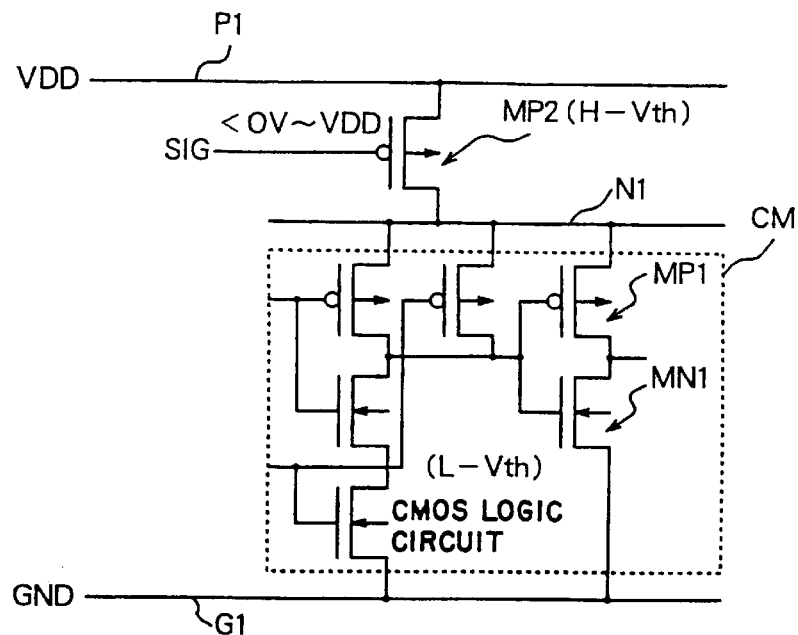
5-TH ENBODIMENT
OF THIS INVENTION
F I G. 7
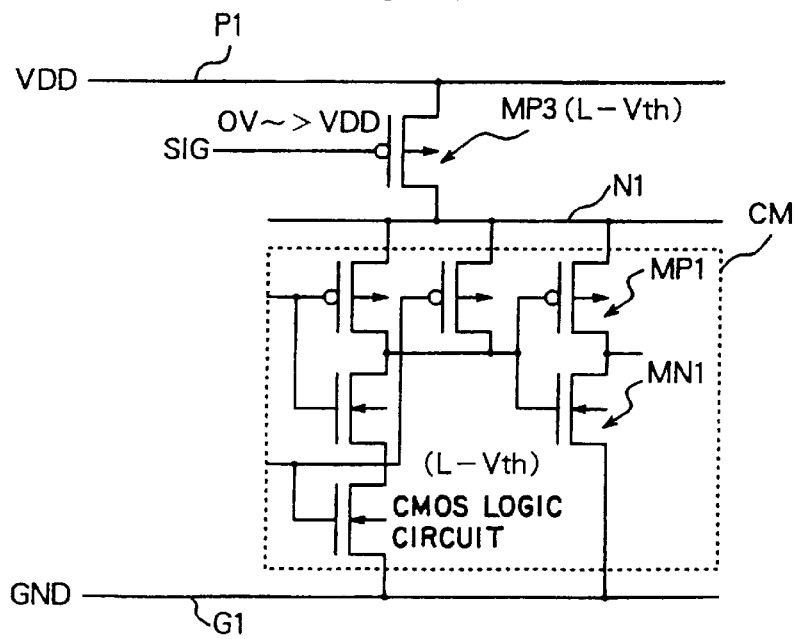
6-TH ENBODIMENT
OF THIS INVENTION
F I G. 8

7-TH ENBODIMENT OF THIS INVENTION

8-TH ENBODIMENT OF THIS INVENTION

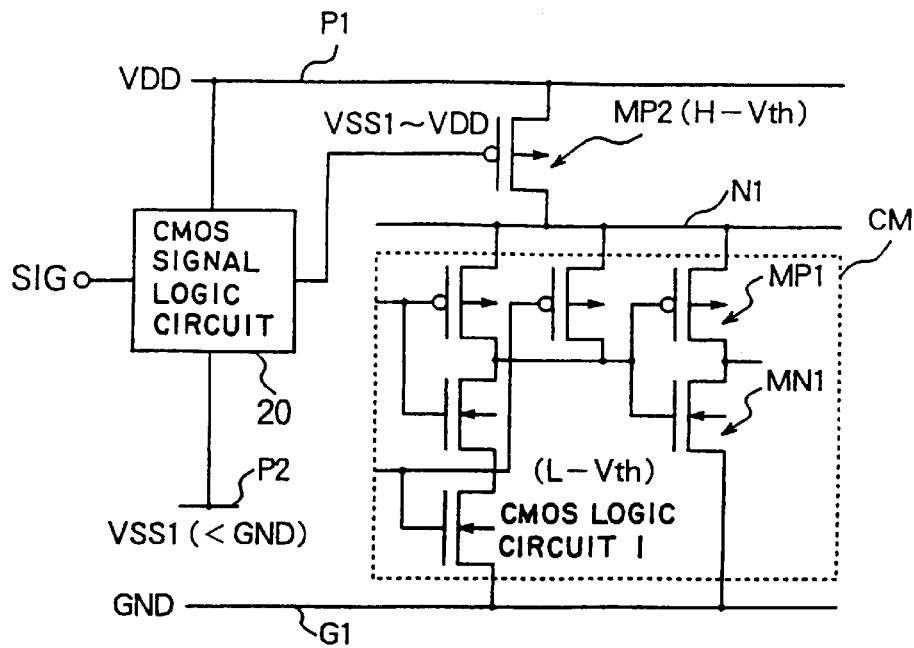
9-TH ENBODIMENT
OF THIS INVENTION
F I G. 11
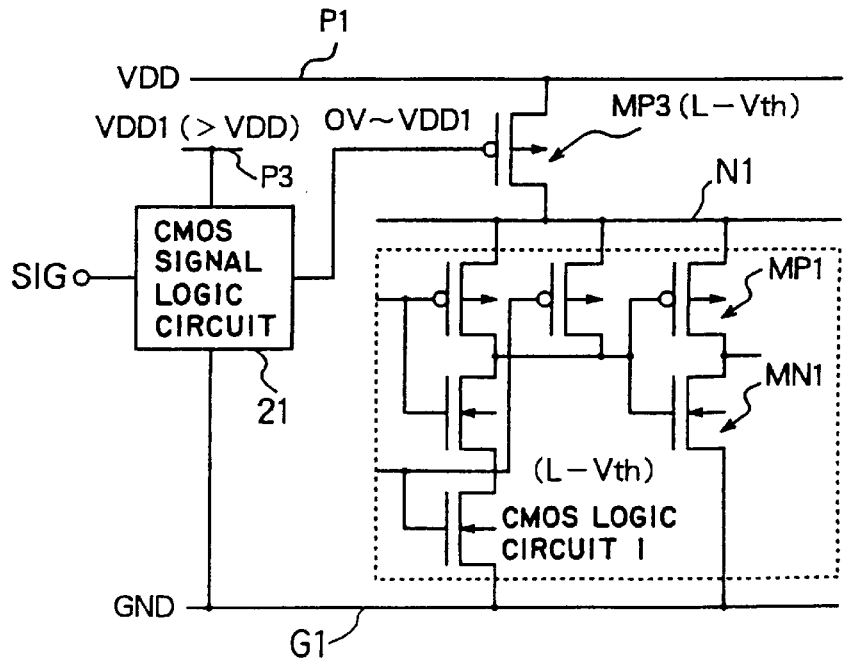
10-TH ENBODIMENT
OF THIS INVENTION
F I G. 12

11-TH ENBODIMENT
OF THIS INVENTION

12-TH ENBODIMENT
OF THIS INVENTION

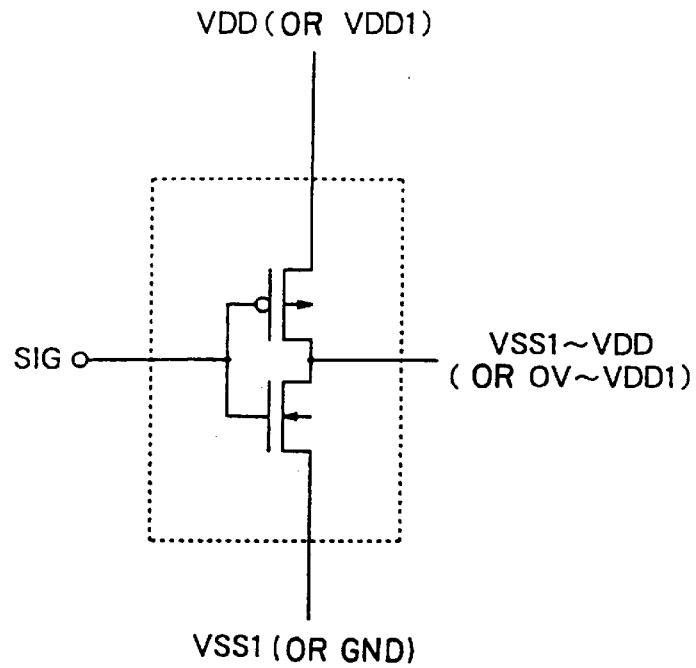
CMOS SIGNAL LOGIC CIRCUIT
F I G. 15
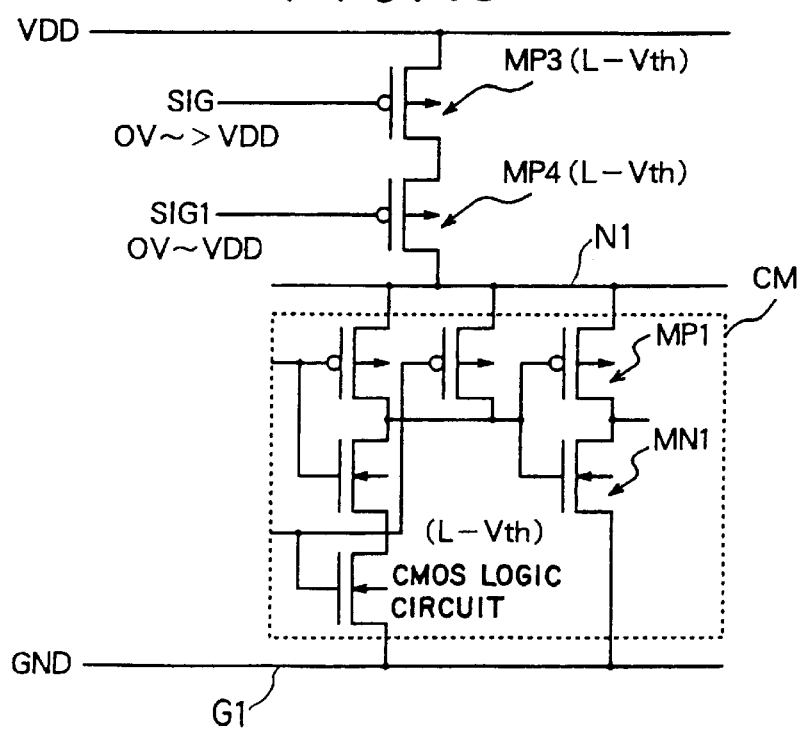
12-TH ENBODIMENT OF THIS INVENTION
F I G. 16

14-TH EMBODIMENT
OF THIS INVENTION

MT-CMOS CIRCUIT

SEMICONDUCTOR INTEGRATED CIRCUIT DEVICE

BACKGROUND OF THE INVENTION

This invention relates to a semiconductor integrated circuit device, and more particularly to a semiconductor integrated circuit device provided with a CMOS logic circuit capable of securely carrying out ON/OFF control of MOS transistor for controlling current in the stand-by state even if the power supply voltage is lowered.

A conventional MT-CMOS circuit (Multi Threshold-CMOS circuit) is shown in FIG. 20.

As shown in FIG. 20, the conventional semiconductor integrated circuit device includes a CMOS logic circuit CM, and a P-channel MOS transistor MP2 for controlling current in stand-by state.

Hitherto, the MT-CMOS circuit is caused to be operative at a low voltage for the purpose of realization of low power consumption. For this reason, P-channel MOS transistor MP1 and N-channel MOS transistor MN1, etc. forming the CMOS logic circuit CM are caused to have low threshold value to suppress delay of propagation of signal at the logic gate. For example, the threshold value of the P-channel MOS transistor MP1 is caused to be −0.2 V and the threshold value of the N-channel MOS transistor MN1 is caused to be 0.2V, etc.

However, even with the circuit configuration including MOS transistors of low threshold value, there results in an increased value of leakage current also in the state where the circuit operation is halted (stand-by state). This cannot be disregarded. In view of the above, there was employed a configuration in which P-channel MOS transistor MP2 of high threshold value (e.g., −0.7 V, etc.) is inserted between the power supply line and the MOS transistors of low threshold value constituting the CMOS logic circuit. Further, the P-channel MOS transistor MP2 was turned OFF by applying the same voltage as the power supply voltage VDD to its gate in the stand-by state to thereby reduce such leakage current. On the other hand, the P-channel MOS transistor MP2 was turned ON by applying 0V to its gate in the operating state to thereby deliver power supply voltage VDD to the CMOS logic circuit (see, e.g., "1V operation MTCMOS DSP employing low voltage applicable power control mechanism" (particularly "MTCMOS circuit" of FIG. 2) by Mr. Shinichiro Mutoh et al., NTT LSI Research Institute, Technical Report of the Institute of Electronics and Communication Engineering of Japan, Vol. 96, No. 107, pp. 15–20, Technical Research Report of the Institute of the Electronic Information and Communication of Japan).

However, in the prior art, there are problems as described below. Namely, at the time of stand-by state of MT-CMOS, power supply voltage VDD is applied to the source of the P-channel MOS transistor MP2 for reducing leakage current and 0V which is low level is applied to the gate. Therefore, as the gate-source voltage VGS of the P-channel MOS transistor MP2, as far as VDD is only applied even at the maximum. Accordingly, when the P-channel MOS transistor MP2 is caused to be operative at a low voltage such that the power supply voltage and the threshold value of the transistor are close to each other, it cannot be sufficiently turned ON.

In such a case, the channel width must be enlarged in order to lower ON resistance of the P-channel MOS transistor MP2. As a result, the chip area is increased. Moreover, when the power supply voltage is caused to be less than the threshold value of the P-channel MOS transistor MP2, it becomes difficult to allow this transistor to be operative. It is the premise that transistor of high threshold value is used as the P-channel MOS transistor MP2 so that leakage current sufficiently becomes small when it is caused to be turned OFF at the time of stand-by (stand-by state) for the purpose of reducing leakage current in the stand-by state. Accordingly, when the threshold value is assumed to be −0.7 V, the minimum power supply voltage from a viewpoint of practical use is considered to be about 1V (the variable range of the threshold value is assumed to be −0.7 V±0.1 V, and the change in the power supply voltage is assumed to be 1 V±10%). Thus, when the power supply voltage becomes equal to, e.g., 0.5 V, the operating voltage does not exceed the threshold value. As a result, ON/OFF control cannot be carried out.

As described above, in the prior art, in the case where the power supply voltage VDD is lowered, the power supply voltage and the threshold value of the MOS transistor become close to each other. As a result, ON/OFF control becomes difficult. In addition, there results increased channel width in ON state. Ultimately, the MOS transistor becomes difficult to function.

SUMMARY OF THE INVENTION

It is a principal object of this invention to apply 0V or less, or higher voltage of VDD or more in place of the conventional system in which signal of 0V-VDD is applied to the gate of the MOS transistor for controlling current in the stand-by state in the CMOS logic circuit to thereby reliably carry out ON/OFF operation of the MOS transistor for controlling current in the stand-by state even if the power supply voltage VDD is allowed to be low voltage.

It is an another object of this invention to improve reliability by using the CMOS logic circuit and the MOS transistor for controlling current in the stand-by state in the state where excessive voltage is not applied to any portion thereof.

It is a further object of this invention to provide a semiconductor integrated circuit device effective for realization of miniaturization and reduced withstand voltage in semiconductor integrated circuit devices in which miniaturization thereof has been developed and withstand voltage has a tendency to be lowered.

In accordance with this invention, an approach is employed to apply 0V or less, or higher voltage of VDD or more to the gate of the MOS transistor for controlling current in the stand-by state in the CMOS logic circuit in place of the conventional system of applying signal of 0V-VDD thereto, thereby permitting the MOS transistor for controlling current in the stand-by state to reliably carry out ON/OFF operation even if the power supply voltage VDD is caused to be low voltage. Thus, increase in the channel width of MOS transistors constituting the circuit can be prevented. Further, since the circuit can be constituted by MOS transistors all having the same low threshold value, the process can be simplified.

Moreover, in the case where CMOS signal logic circuit is used at the preceding stage of the CMOS logic circuit, signal from another power supply logic circuit is delivered to this CMOS logic circuit. As a result, level conversion circuit becomes unnecessary. Thus, the circuit can be simplified and the area can be reduced.

Further, since there is employed a configuration in which plural MOS transistors for controlling current in the stand-by state are connected in series, the CMOS logic circuit and the MOS transistor for controlling current in the stand-by state can be used in the state where excessive voltage is not applied to any portion thereof. Accordingly, employment of this circuit configuration is extremely effective for improvement in reliability.

Further, in the semiconductor integrated circuit device in which miniaturization of the semiconductor integrated circuit device has been developed and the withstand voltage has a tendency to be lowered, this invention provides conspicuous advantages in realization thereof.

In addition, since the semiconductor integrated circuit device of this invention is of the low power consumption type, such semiconductor integrated circuit device is applied to battery driven equipments including portable equipments, e.g., PDA, PHS, pocket (portable) telephone, etc., thereby making it possible to exhibit extremely conspicuous advantages.

BRIEF DESCRIPTION OF THE DRAWINGS

FIG. 1 is a view showing the circuit configuration of a semiconductor integrated circuit device of a first embodiment according to this invention.

FIG. 2 is a view showing the circuit configuration of a semiconductor integrated circuit device of a second embodiment according to this invention.

FIG. 7 is a view showing the circuit configuration of a semiconductor integrated circuit device of a fifth embodiment according to this invention.

FIG. 8 is a view showing the circuit configuration of a semiconductor integrated circuit device of a sixth embodiment according to this invention.

FIG. 11 is a view showing the circuit configuration of a semiconductor integrated circuit device of a ninth embodiment according to this invention.

FIG. 12 is a view showing the circuit configuration of a semiconductor integrated circuit device of a tenth embodiment according to this invention.

FIG. 15 is a view showing the circuit configuration of CMOS signal logic circuit.

FIG. 16 is a view showing the circuit configuration of a semiconductor integrated circuit device of a thirteenth embodiment according to this invention.

Figure 3:
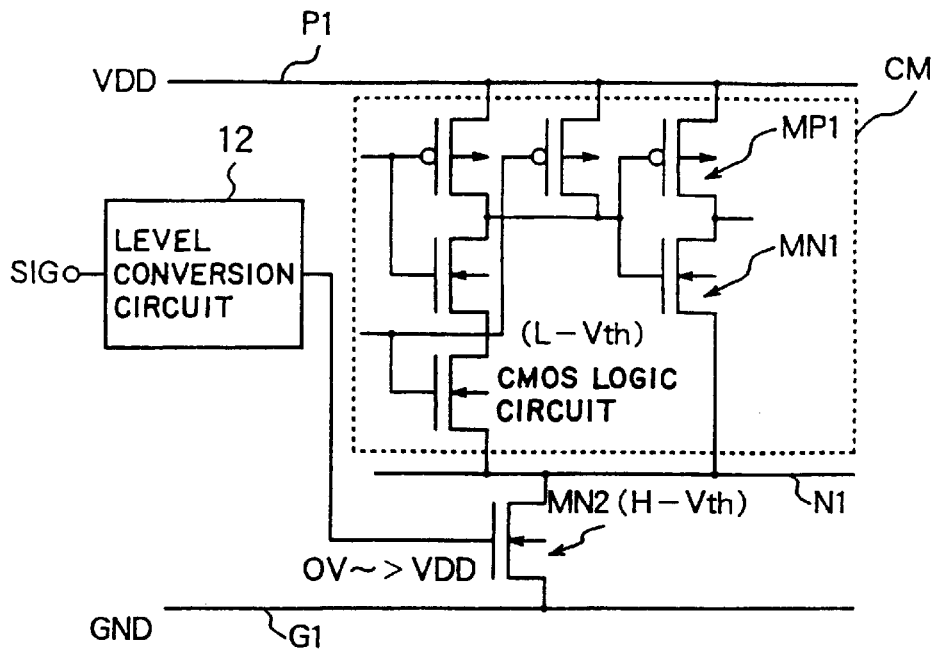
FIG. 3 is a view showing the circuit configuration of a semiconductor integrated circuit device of a third embodiment according to this invention.

DESCRIPTION OF THE PREFERRED EMBODIMENTS (1) First Embodiment

The circuit configuration of a semiconductor integrated circuit device of a first embodiment according to this invention is shown in FIG. 1.

As shown in FIG. 1, the semiconductor integrated circuit device of this invention includes a CMOS logic circuit CM, a P-channel MOS transistor MP2 for controlling current in the stand-by state, and a level conversion circuit 10.

The CMOS logic circuit CM is of a structure in which the first node N1 is caused to be power supply line and the other end is connected to ground line G1. The threshold value of transistors MP1, MN1, etc. constituting the CMOS logic circuit CM is set to value lower than ordinary value. In this embodiment, it is to be noted that the CMOS logic circuit CM is shown only as an example of more practical circuit. Accordingly, this invention can be applied to various logic circuits including NAND circuit, AND circuit, OR circuit, NOR circuit or Exclusive logical sum circuit, etc. This similarly applies to the embodiments mentioned below.

The P-channel MOS transistor MP2 for controlling current in the stand-by state is of a structure in which the source is connected to the first power supply line P1 and the drain is connected to the first node N1. The threshold value of the P-channel MOS transistor MP2 is set to a value higher than the threshold value of the transistors MP1, MN1, etc. constituting the CMOS logic circuit CM.

Moreover, the level conversion circuit 10 has output terminal connected to the gate of the P-channel MOS transistor MP2, and includes control input terminal SIG. The level conversion circuit 10 is operative to output a signal in which low level indicates negative voltage and high level indicates potential VDD which is the same as that of the first power supply line P1 in dependency upon high level and low level of (pulse) signal applied to the control input terminal SIG to thereby carry out ON/OFF control of the P-channel MOS transistor MP2. The level conversion circuit 10 may respectively provide outputs of low level and high level in correspondence with high level and low level of voltage on the control input terminal SIG, or may respectively provide outputs of high level and low level in correspondence therewith in a manner opposite to the above.

In this case, the negative voltage refers to a voltage in which gate-source voltage VGS is the threshold value or more in the state where voltage VDD of the first power supply line P1 through which source voltage of the P-channel MOS transistor MP2 is being delivered is lower voltage less than the threshold value of the P-channel MOS transistor MP2.

As an example of explanation of the operation, the CMOS logic circuit CM is assumed to be composed of respective transistors of P-channel MOS transistor MP1 having threshold value of −0.2 V and N-channel MOS transistor MN1 having threshold value of 0.2 V. Moreover, the threshold value of the P-channel MOS transistor MP2 for reducing leakage current in the stand-by state is assumed to be, e.g., −0.7 V. Further, the power supply voltage VDD is assumed to be power supply voltage of the minimum operating voltage at which this CMOS logic circuit CM is operative, e.g., 0.5 V. In addition, let suppose the case where output of the level conversion circuit 10, i.e., voltage applied to the gate of the P-channel MOS transistor MP2 for reducing leakage current in the stand-by state is set so that output of low level is caused to be negative voltage which is not 0V, e.g., −0.8 V, and output of high level is caused to be 0.5 V which is the same as the power supply voltage VDD.

In this case, when output of the level conversion circuit 10 is at low level, −0.8 V which is negative voltage is applied to the gate of the P-channel MOS transistor MP2, and the gate-source voltage VGS becomes equal to −1.3 V (=−0.8 V−0.5 V) at the maximum. For this reason, the P-channel MOS transistor MP2 can be sufficiently turned ON because the threshold value is −0.7 V. Thus, employment of negative voltage as voltage applied to the gate of the P-channel MOS transistor MP2 can sufficiently ensure supply of current to the CMOS logic circuit CM at the time of operation even under low voltage state.

On the other hand, when output of the level conversion circuit 10 is at high level, 0.5 V which is the same as the power supply voltage VDD is applied to the gate of the P-channel MOS transistor MP2, and the gate-source voltage VGS becomes equal to minimum value of 0V. For this reason, the P-channel MOS transistor MP2 having threshold value of −0.7 V is placed in OFF state. Thus, since the threshold value of the P-channel MOS transistor MP2 for reducing leakage current in the stand-by state is caused to be high as compared to MOS transistors MP1, MN1 constituting the CMOS logic circuit CM, there can result low power consumption mode in which the leakage current is suppressed in the stand-by state.

(2) Second Embodiment

The circuit configuration of a semiconductor integrated circuit device of a second embodiment according to this invention is shown in FIG. 2.

As shown in FIG. 2, the semiconductor integrated circuit device of this invention includes a CMOS logic circuit CM, a P-channel MOS transistor MP3 for controlling current in the stand-by state, and a level conversion circuit 11.

The CMOS logic circuit CM is of a structure in which the first node N1 is caused to be power supply line and the other end thereof is connected to ground line G1. The threshold value of transistors MP1, MN1, etc. constituting the CMOS logic circuit CM is set to value lower than ordinary vlaue.

The P-channel MOS transistor MP3 for controlling current in the stand-by state is of a structure in which the source is connected to the first power supply line P1 and the drain is connected to the first node N1. The threshold value of the P-channel MOS transistor MP3 is set to lower value to the same degree as the threshold value of transistors MP1, MN1, etc. constituting the CMOS logic circuit CM.

Moreover, the level conversion circuit 11 has output terminal connected to the gate of the P-channel MOS transistor MP3, and includes control input terminal SIG. The level conversion circuit 11 is operative to output a signal in which low level indicates ground potential (e.g., 0V) and high level indicates voltage which exceeds voltage on the first power supply line P1 in dependency upon high level and low level of signal applied to the control input terminal SIG to thereby carry out ON/OFF control of the P-channel MOS transistor MP3. The level conversion circuit 11 may respectively provide outputs of low level and high level in correspondence with high level and low level of voltage on the control input terminal SIG, or may respectively provide outputs of high level and low level in correspondence therewith in a manner opposite to the above.

In this case, the voltage which exceeds voltage on the first power supply line refers to a voltage to allow the gate-source voltage VGS to take positive value so that the leakage current is not above the already fixed value resulting from the fact that the threshold value of the P-channel MOS transistor MP3 is caused to be low, and is a voltage such that voltage of high level is caused to be high in correspondence with to what degree the threshold value of the P-channel MOS transistor MP3 is caused to be low.

As an example of explanation of the operation, the CMOS logic circuit CM is assumed to be composed of, e.g., respective transistors of P-channel MOS transistor MP1 having threshold value of −0.2 V and N-channel MOS transistor MN1 having threshold value of 0.2 V. Moreover, the threshold value of the P-channel MOS transistor MP3 for reducing leakage current in the standby state is set to, e.g., −0.2 V similarly to MOS transistors constituting the CMOS logic circuit CM. Further, the power supply voltage VDD is set to power supply voltage of the minimum operating voltage at which this CMOS logic circuit CM is operative, e.g., 0.5 V. In addition, let suppose the case where output of the level conversion circuit 11, i.e., voltage applied to the gate of the P-channel MOS transistor MP3 for reducing leakage current in the stand-by state is set so that output of low level is caused to be ground potential, e.g., 0V and output of high level is caused to be, e.g., 1V higher than the power supply voltage VDD.

In this case, when output of the level conversion circuit 11 is at low level, 0V is applied to the gate of the P-channel MOS transistor MP3, and the gate-source voltage VGS becomes −0.5 V at the maximum. For this reason, the P-channel MOS transistor MP3 can be sufficiently turned ON because the threshold value is −0.2 V. Thus, employment of a method of reducing the threshold value of the P-channel MOS transistor MP3 can sufficiently ensure supply of current to the CMOS logic circuit CM at the time of operation even under low voltage state.

On the other hand, when output of the level conversion circuit 11 is at high level, e.g., 1V which is higher than the power supply voltage VDD is applied to the gate of the P-channel MOS transistor MP3, and the gate-source voltage VGS becomes minimum value of +0.5 V. Thus, the P-channel MOS transistor MP3 having threshold value of −0.2 V is placed in OFF state. Difference between the gate-source voltage VGS and the threshold value at this time becomes equal to 0.7 V (+0.5 V−(−0.2 V)). Thus, VGS is reduced while using the same relatively low value as the threshold values of the MOS transistors MP1, MN1 constituting the CMOS logic circuit CM and the P-channel MOS transistor MP3 for reducing leakage current in the stand-by state. Accordingly, there can result low power consumption mode in which the leakage current is suppressed at the time of stand-by operation.

(3) Third Embodiment

The circuit configuration of a semiconductor integrated circuit device of a third embodiment according to this invention is shown in FIG. 3.

As shown in FIG. 3, the semiconductor integrated circuit device of this invention includes a CMOS logic circuit CM, an N-channel MOS transistor MN2 for controlling current in the stand-by state, and a level conversion circuit 12.

The CMOS logic circuit CM is of a structure in which the first power supply line P1 is caused to be power supply line and its ground line is connected to the first node N1. The threshold value of transistors MP1, MN1, etc. constituting the CMOS logic circuit CM is set to value lower than ordinary value.

The N-channel MOS transistor MN2 for controlling current in the stand-by state is of a structure in which the source is connected to ground line G1 and the drain is connected to the first node N1. The threshold value of the N-channel MOS transistor MN2 is set to value higher than the threshold value of transistors MP1, MN1, etc. constituting the CMOS logic circuit CM.

Moreover, the level conversion circuit 12 has output terminal connected to the gate of the N-channel MOS transistor MN2 and includes control input terminal SIG. The level conversion circuit 12 is operative to output a signal in which high level indicates voltage which exceeds voltage VDD of the first power supply line P1 and low level indicates ground potential 0V in dependency upon high level and low level of signal applied to the control input terminal SIG to thereby carry out ON/OFF control of the N-channel MOS transistor MN2. The level conversion circuit 12 may respectively provide output of low level and output of high level in correspondence with high level and low level of voltage on the control input terminal SIG, or may respectively provide output of high level and output of low level in correspondence therewith in a manner opposite to the above.

In this example, voltage which exceeds voltage on the first power supply line refers to a voltage in which the gate-source voltage VGS is above the threshold value in the state where voltage of the first power supply line P1 is lower voltage less than the threshold value of the N-channel MOS transistor MN2, and a voltage corresponding to threshold value of the N-channel MOS transistor MN2 or more.

As an example of explanation of the operation, the CMOS logic circuit CM is assumed to be composed of, e.g., respective transistors of P-channel MOS transistor MP1 having threshold value of −0.2 V and N-channel MOS transistor MN1 having threshold value of 0.2 V. Moreover, the threshold value of the N-channel MOS transistor MN2 for reducing leakage current in the stand-by state is assumed to be, e.g., 0.7 V. Further, the power supply voltage VDD is assumed to be the power supply voltage of the minimum operating voltage at which this CMOS logic circuit is operative, e.g., 0.5 V. Further, let suppose the case where output of the level conversion circuit 12, i.e., voltage applied to the gate of the N-channel MOS transistor MN2 for reducing leakage current in the stand-by state is set so that output of low level is caused to be ground potential, e.g., 0V and output of high level is caused to be, e.g., 1.3 V higher than the power supply voltage VDD.

In this case, when output of the level conversion circuit 12 is at high level, 1.3V is applied to the gate of the N-channel MOS transistor MN2, and the gate-source voltage VGS becomes 1.3 V at the maximum. For this reason, the N-channel MOS transistor MN2 can be sufficiently turned ON because the threshold value is 0.7 V. Thus, employment of voltage higher than power supply voltage as voltage applied to the gate of the N-channel MOS transistor MN2 can sufficiently ensure supply of current to the CMOS logic circuit CM at the time of operation even under low voltage state.

On the other hand, when output of the level conversion circuit 12 is at low level, ground potential, e.g., 0V is applied to the gate of the N-channel MOS transistor MN2, and the source has ground potential. Accordingly, the gate-source voltage VGS becomes equal to 0V. As a result, the N-channel MOS transistor MN2 having threshold value of 0.7 V is placed in OFF state. Thus, since the threshold value of the N-channel MOS transistor MN2 for reducing leakage current in the stand-by state is caused to be high as compared to the MOS transistors MP1, MN1 constituting the CMOS logic circuit CM, there can result low power consumption mode in which leakage current is suppressed in the stand-by state.

(4) Fourth Embodiment

Figure 4:
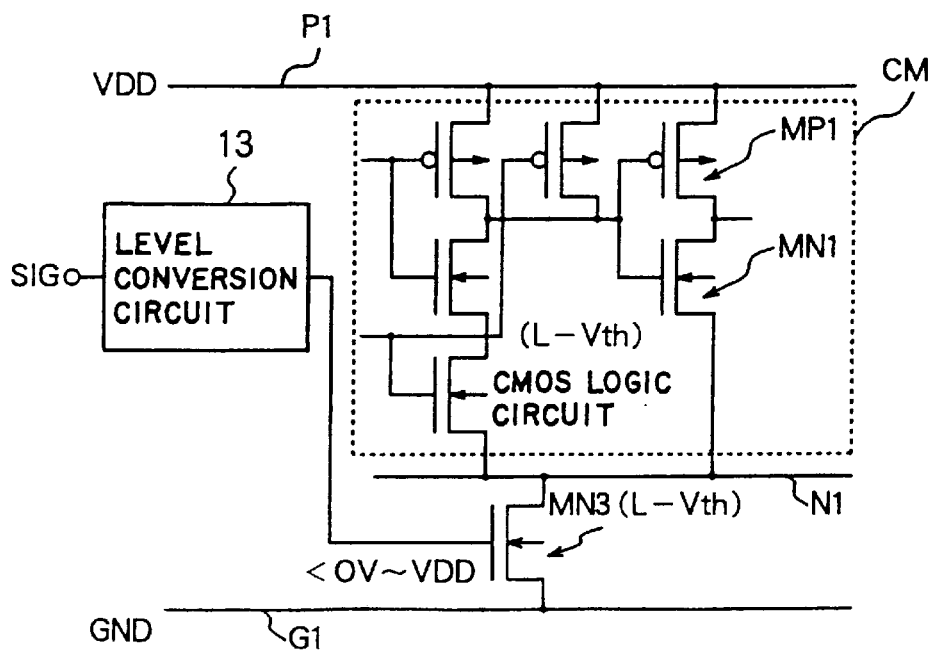
FIG. 4 is a view showing the circuit configuration of a semiconductor integrated circuit device of a fourth embodiment according to this invention.

The circuit configuration of a semiconductor integrated circuit device of a fourth embodiment according to this invention is shown in FIG. 4.

As shown in FIG. 4, the semiconductor integrated circuit device of this invention includes a CMOS logic circuit CM, an N-channel MOS transistor MN3 for controlling current in the stand-by state, and a level conversion circuit 13.

The CMOS logic circuit CM is of a structure in which the first power supply line P1 is caused to be power supply line and its ground line is connected to the first node N1. The threshold value of the transistors MP1, MN1, etc. constituting the CMOS logic circuit CM is set to value lower than the ordinary value.

The N-channel MOS transistor MN3 for controlling current in the stand-by state is of a structure in which the source is connected to ground line G1 and the drain is connected to the first node N1. The threshold value of the N-channel MOS transistor MN3 is set to a value to the same degree as the threshold value of transistors MP1, MN1, etc. constituting the CMOS logic circuit CM.

Moreover, the level conversion circuit 13 has output terminal connected to the gate of the N-channel MOS transistor MN3, and includes control input terminal SIG. The level conversion circuit 13 is operative to output a signal in which high level indicates the same potential VDD as that of the first power supply line P1 and low level indicates negative voltage in dependency upon high level and low level of signal applied to the control input terminal SIG to thereby carry out ON/OFF control of the N-channel MOS transistor MN3. The level conversion circuit 13 may respectively provide output of low level and output of high level in correspondence with high level and low level of voltage on the control input terminal SIG, or may respectively provide output of high level and output of low level in correspondence therewith in a manner opposite to the above.

In this case, negative voltage refers to a voltage in which the gate-source voltage VGS is caused to be negative value so that leakage current is not above the already fixed value resulting from the fact that the threshold value of the N-channel MOS transistor MN3 is caused to be low, and is defined as negative voltage in correspondence with to what degree the threshold value is caused to be low.

As an example of explanation of the operation, the CMOS logic circuit CM is assumed to be composed of, e.g., respective transistors of P-channel MOS transistor MP1 having threshold value of −0.2 V and N-channel MOS transistor MN1 having threshold value of 0.2 V. Moreover, the threshold value of the N-channel MOS transistor MN3 for reducing leakage current in the stand-by state is assumed to be, e.g., 0.2 V. Further, the power supply voltage VDD is assumed to be power supply voltage of the minimum operating voltage at which this CMOS logic circuit is operative, e.g., 0.5 V. In addition, let suppose the case where output of the level conversion circuit 13, i.e., voltage applied to the gate of the N-channel MOS transistor MN3 for reducing leakage current in the stand-by state is set so that output of low level is caused to be negative voltage which is not 0V, e.g., −0.5 V and output of high level is caused to be power supply voltage VDD.

In this case, when output of the level conversion circuit 13 is at high level, 0.5 V which is power supply voltage is applied to the gate of the N-channel MOS transistor MN3 and the gate-source voltage VGS becomes equal to 0.5 V at the maximum. For this reason, the N-channel MOS transistor MN3 can be sufficiently turned ON because the threshold value is 0.2 V. Thus, employment of an approach to lower the threshold value of the N-channel MOS transistor MN3 can sufficiently ensure supply of current to the CMOs logic circuit CM at the time of operation even under low voltage state.

On the other hand, when output of the level conversion circuit 13 is at low level, −0.5 V which is negative voltage is applied to the gate of the N-cannel MOS transistor MN3, and the source has ground potential. Accordingly, the gate-source voltage VGS becomes equal to −0.5 V (=0V −0.5 V). As a result, the N-channel MOS transistor MN3 having threshold value 0.2 V is placed in OFF state. At this time, difference between the gate-source voltage VGS and the threshold value becomes equal to −0.7 V (=−0.5 V −0.2 V). Thus, VGS is reduced while using relatively lower value as threshold values of the MOS transistors MP1, MN1 constituting the CMOS logic circuit CM and the N-channel MOS transistor MN3 for reducing leakage current in the stand-by state. Accordingly, there can result low power consumption mode in which leakage current is suppressed in the stand-by state.

(5) Level Conversion Circuit

Figure 5A:
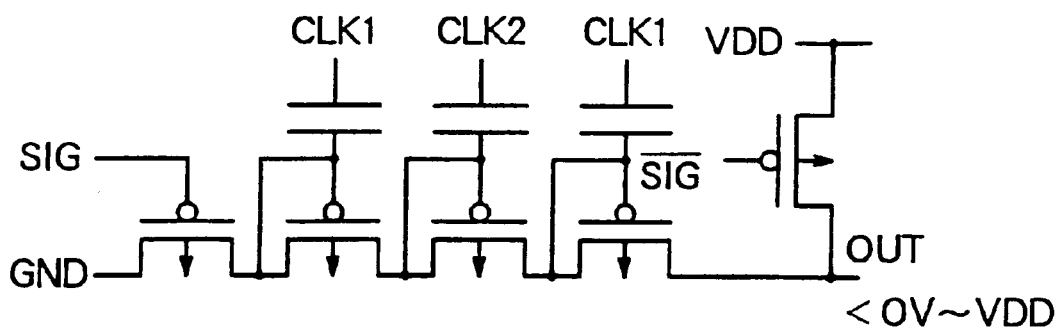
FIG. 5A is a circuit diagram of level conversion circuit (1).

An example of the circuit configuration of level conversion circuit (1) is shown in FIG. 5A. This level conversion circuit can be used in the first and fourth embodiments of this invention.

The circuit shown in FIG. 5A is a typical charge pump circuit, and is composed of plural P-channel MOS transistors and capacitors, etc. The number of stages of charge pumps may be suitably set as occasion demands, thereby making it possible to adjust output signal OUT.

Figure 5B:
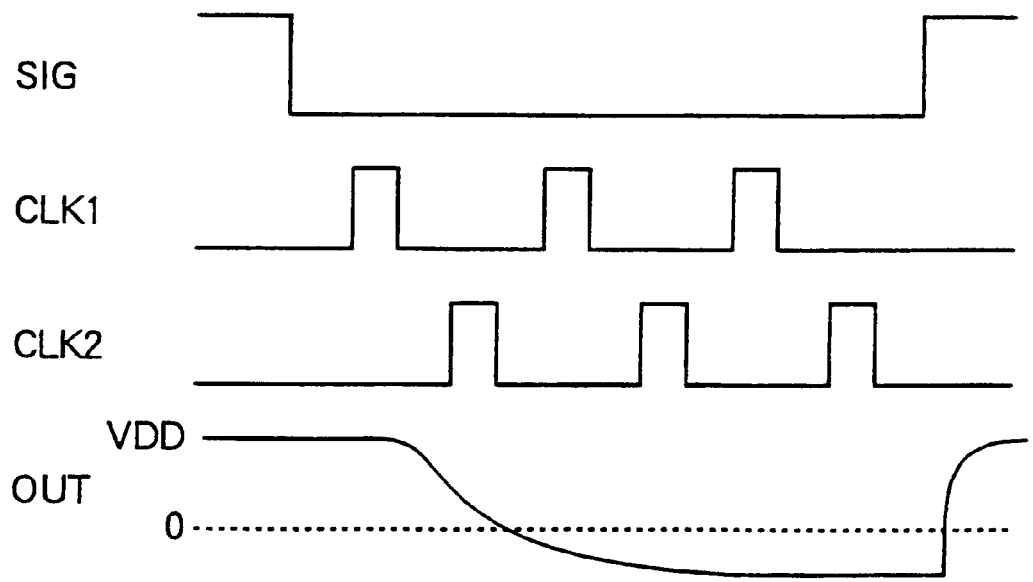
FIG. 5B is a timing chart showing the operation of the level conversion circuit (1).

As shown in FIG. 5B, clocks CLK1 and CLK2 are suitably inputted by control input signal SIG, whereby electric charges charged in the capacitor are shifted in succession to the capacitor of the side close to the ground line by the P-channel MOS transistor. As a result, negative voltage lower than ground potential (e.g., 0V) is outputted as output signal OUT of low level. In this example, power supply potential VDD is outputted as output of high level.

Figure 6A:
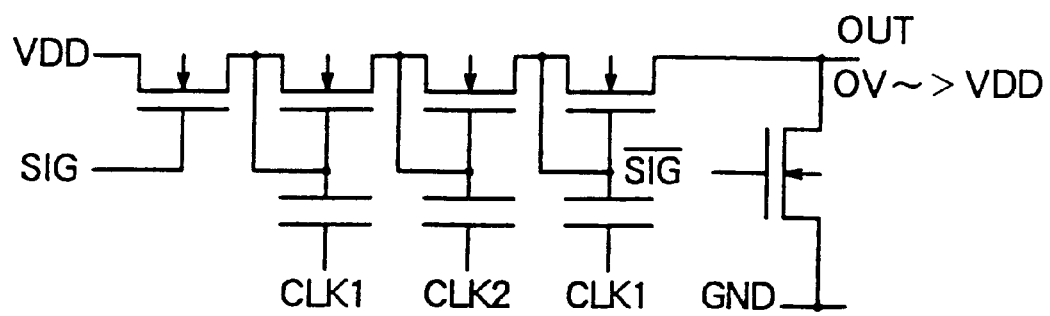
FIG. 6A is a circuit diagram of level conversion circuit (2).

Further, an example of the circuit configuration of level conversion circuit (2) is shown in FIG. 6A. This level conversion circuit can be used in the second and third embodiments of this invention.

The circuit shown in FIG. 6A is a typical charge pump circuit adapted for shifting electric charges in a direction opposite to that shown in FIG. 5, and is composed of plural N-channel MOS transistors and capacitors, etc. The number of stages of the charge pumps may be suitably set as occasion demands, thereby making it possible to adjust output signal OUT.

As shown in FIG. 5B, clocks CLK1 and CLK2 are suitably inputted by control input signal SIG, whereby electric charges charged in the capacitor are shifted in succession to the capacitor of the side close to output signal OUT by the N-channel MOS transistor. As a result, voltage which exceeds the power supply voltage VDD is outputted as output signal OUT of high level. In this example, ground potential (e.g., 0V) is outputted as output of low level.

(6) Fifth to Eighth Embodiments

The circuit configuration of a semiconductor integrated circuit device of a fifth embodiment according to this invention is shown in FIG. 7.

As shown in FIG. 7, this semiconductor integrated circuit device includes a CMOS logic circuit CM comprised of transistors of low threshold value, and a P-channel MOS transistor MP2 for controlling current in the stand-by state of high threshold value.

The fifth embodiment is characterized in that a predetermined control voltage is directly applied to the P-channel MOS transistor MP2 without provision of the level conversion circuit in the first embodiment.

Namely, there is employed an approach to output a signal in which low level indicates negative voltage and high level indicates the same potential VDD as that of the first power supply line P1 in dependency upon high level and low level of signal applied to the control input terminal SIG to thereby carry out ON/OFF control of the P-channel MOS transistor MP2.

The circuit configuration of a semiconductor integrated circuit device of a sixth embodiment according to this invention is shown in FIG. 8.

As shown in FIG. 8, this semiconductor integrated circuit device includes a CMOS logic circuit CM composed of transistors of low threshold value, and a P-channel MOS transistor MP3 for controlling current in the stand-by state of low threshold value.

The sixth embodiment is characterized in that a predetermined control voltage is directly applied to the P-channel MOS transistor MP3 without provision of the level conversion circuit in the second embodiment.

Namely, there is employed an approach to output a signal in which low level indicates ground potential (e.g., 0V) and high level indicates voltage exceeding voltage on the first power supply line P1 in dependency upon high level and low level of signal applied to the control input terminal SIG to thereby carry out ON/OFF control of the P-channel MOS transistor MP3.

Figure 9:
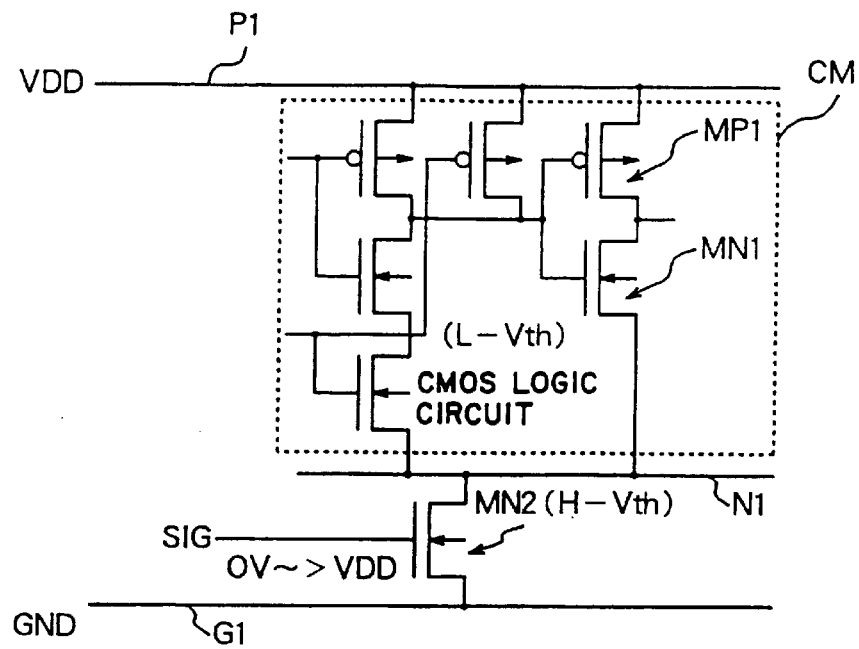
FIG. 9 is a view showing the circuit configuration of a semiconductor integrated circuit device of a seventh embodiment according to this invention.

The circuit configuration of a semiconductor integrated circuit device of a seventh embodiment according to this invention is shown in FIG. 9.

As shown in FIG. 9, this semiconductor integrated circuit device includes a CMOS logic circuit CM composed of transistors of low threshold value, and an N-channel MOS transistor MN2 for controlling current in the stand-by state of high threshold value.

The seventh embodiment Is characterized in that a predetermined control voltage is directly applied to the N-channel MOS transistor MN2 without provision of level conversion circuit in the third embodiment.

Namely, there is employed an approach to output a signal in which high level indicates voltage exceeding voltage VDD of the first power supply line P1 and low level indicates ground potential 0V in dependency upon high level and low level of signal applied to the control input terminal SIG to thereby carry out ON/OFF control of the N-channel MOS transistor MN2.

Figure 10:
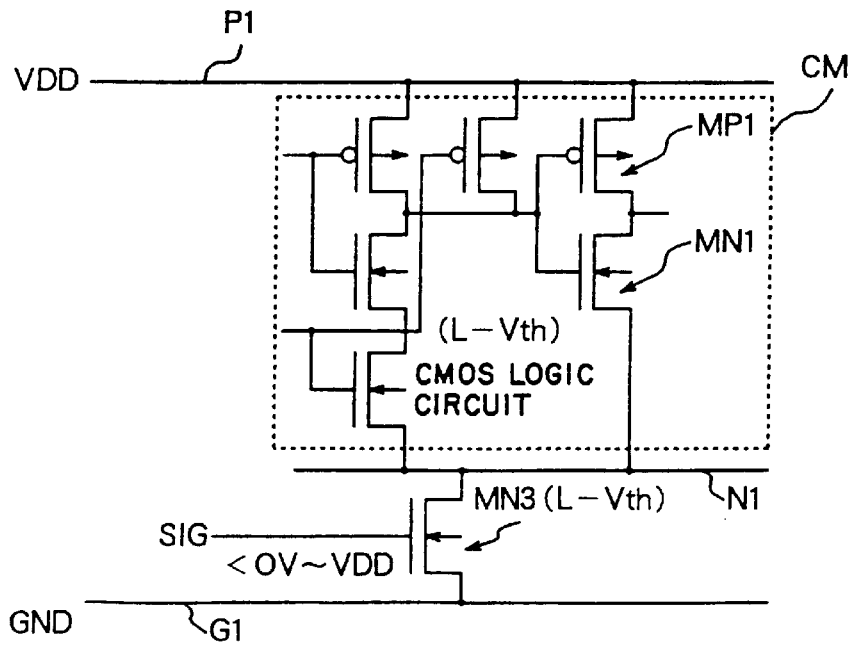
FIG. 10 is a view showing the circuit configuration of a semiconductor integrated circuit device of an eighth embodiment according to this invention.

The circuit configuration of a semiconductor integrated circuit device of an eighth embodiment according to this invention is shown in FIG. 10.

As shown in FIG. 10, this semiconductor integrated circuit device includes a CMOS logic circuit CM composed of transistors of low threshold value, and an N-channel MOS transistor MN3 for controlling current in the stand-by state of low threshold value.

The eighth embodiment is characterized in that a predetermined control voltage is directly applied to the N-channel MOS transistor MN3 without provision of the level conversion circuit in the fourth embodiment.

Namely, there is employed an approach to output a signal in which high level indicates the same potential VDD as that of the first power supply line P1 and low level indicates negative voltage in dependency upon high level and low level of signal applied to the control input terminal SIG to thereby carry out ON/OFF control of the N-channel MOS transistor MN3.

(7) Ninth to Twelfth Embodiments

The ninth to twelfth embodiments are characterized in that control voltage is applied by the CMOS signal logic circuit SC in place of determining control voltage applied to the gate of the MOS transistor for reducing leakage current in the stand-by state by using the level conversion circuits at the first to fourth embodiments, respectively.

Namely, in the first to fourth embodiments, the circuit portion in which low level is caused to be voltage lower than GND (e.g., −0.5 V) and high level is caused to be voltage (e.g., 1V) higher than power supply voltage VDD (e.g., 0.5 V) is replaced by the CMOS signal logic circuit using the second or third power supply line as the power supply.

The circuit configuration of a semiconductor integrated circuit device of a ninth embodiment according to this invention is shown in FIG. 11.

This semiconductor integrated circuit device includes a CMOS logic circuit CM comprised of transistors of low threshold value, a P-channel MOS transistor MP2 for controlling current in the stand-by state of high threshold value, and a CMOS signal logic circuit 20.

The CMOS signal logic circuit 20 is comprised of transistors of high threshold value. Moreover, this CMOS signal logic circuit 20 is of a structure in which the power supply line is connected to the first power supply line P1 and its ground line is connected to the second power supply line P2 through which negative voltage VSS1 lower than ground potential is being delivered. Further, the CMOS signal logic circuit 20 is operative to output a signal in which low level indicates voltage VSS1 (negative voltage) of the second power supply line P2 and high level indicates the same potential VDD as that of the first power supply line P1 in dependency upon high level and low level of signal applied to the control input terminal SIG to thereby carry out ON/OFF control of the P-channel MOS transistor MP2.

The circuit configuration of a semiconductor integrated circuit device of a tenth embodiment according to this invention is shown in FIG. 12.

This semiconductor integrated circuit device includes a CMOS logic circuit CM comprised of transistors of low threshold value, a P-channel MOS transistor MP3 for controlling current in the stand-by state of low threshold value, and a CMOS signal logic circuit 21.

The CMOS signal logic circuit 21 is comprised of transistors of high threshold value. Moreover, this CMOS signal logic circuit 21 is of a structure in which the power supply line is connected to third power supply line P3 having voltage (potential) VDD1 higher than voltage (potential) VDD of the first power supply line, and its ground line is connected to ground line G1. Further, the CMOS signal logic circuit 21 is operative to output a signal in which low level indicates ground potential (e.g., 0V) of the ground line G1 and high level indicates voltage VDD1 of the third power supply line P3 in dependency upon high level and low level of signal applied to the control input terminal SIG to thereby carry out ON/OFF control of the P-channel MOS transistor MP3.

Figure 13:
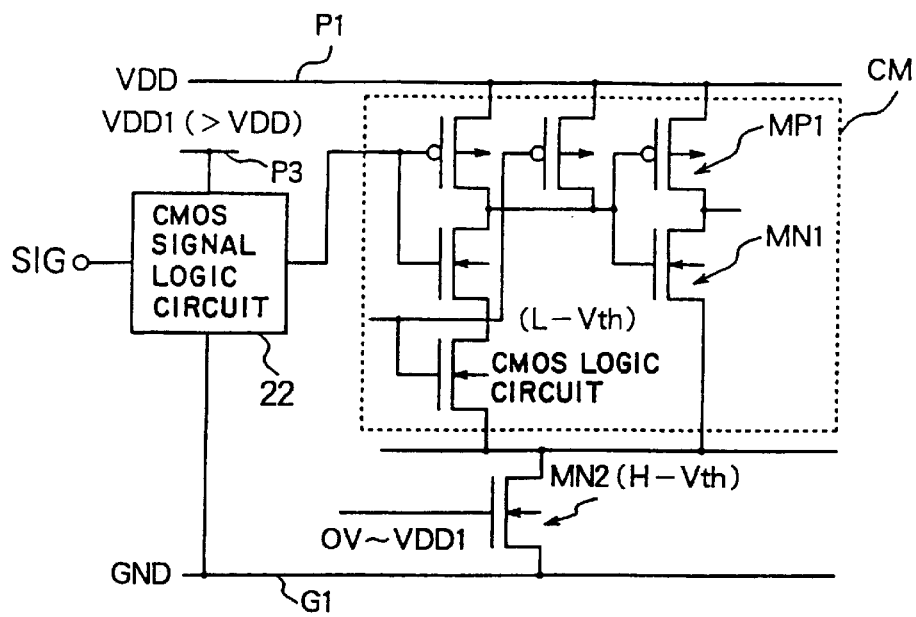
FIG. 13 is a view showing the circuit configuration of a semiconductor integrated circuit device of an eleventh embodiment according to this invention.

The circuit configuration of a semiconductor integrated circuit device of an eleventh embodiment according to this invention is shown in FIG. 13.

This semiconductor integrated circuit device includes a CMOS logic circuit CM comprised of transistors of low threshold value, an N-channel MOS transistor MN2 for controlling current in the stand-by state of high threshold value, and a CMOS signal logic circuit 22.

The CMOS signal logic circuit 22 is comprised of transistors of high threshold value. Moreover, this CMOS signal logic circuit 22 is of a structure in which the power supply line is connected to third power supply line P3 having voltage (potential) VDD1 higher than voltage (potential) VDD of the first power supply line, and its ground line is connected to the ground line G1. Further, the CMOS signal logic circuit 22 is operative to output a signal in which high level indicates voltage VDD1 of the third power supply line P3 and low level indicates ground potential 0V in dependency upon high level and low level of signal applied to the control input terminal SIG to thereby carry out ON/OFF control of the first N-channel MOS transistor MN2.

Figure 14:
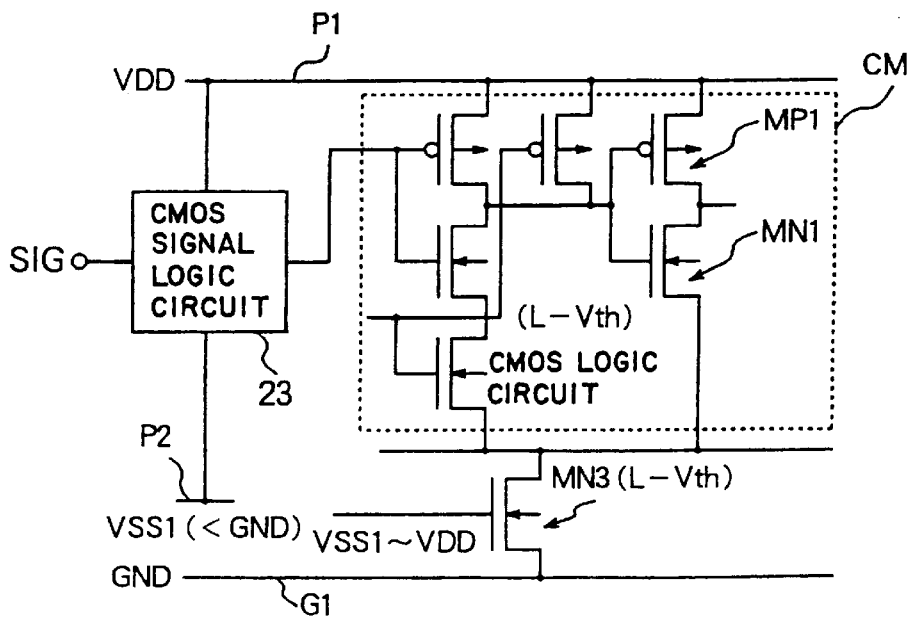
FIG. 14 is a view showing the circuit configuration of a semiconductor integrated circuit device of a twelfth embodiment according to this invention.

The circuit configuration of a semiconductor integrated circuit device of a twelfth embodiment according to this invention is shown in FIG. 14.

This semiconductor integrated circuit device includes a CMOS logic circuit CM comprised of transistors of low threshold value, an N-channel MOS transistor MN3 for controlling current in the stand-by state of low threshold value, and a CMOS signal logic circuit 23.

The CMOS signal logic circuit 23 is comprised of transistors of high threshold value. Moreover, this CMOS signal logic circuit 23 is of a structure in which the power supply line is connected to the first power supply line P1, and its ground line is connected to second power supply line P2 through which negative voltage VSS1 lower than the ground potential is being delivered. Further, the CMOS signal logic circuit 23 is operative to output a signal in which high level indicates the same potential VDD as that of the first power supply line P1 and low level indicates voltage VSS1 of the second power supply in dependency upon high level and low level of signal applied to the control input terminal SIG to thereby carry out ON/OFF control of the N-channel MOS transistor MN3.

(8) CMOS Signal Logic Circuit

An example of the circuit configuration of a CMOS signal logic circuit is shown in FIG. 15.

This CMOS signal logic circuit can be used in the ninth to twelfth embodiments of this invention.

The CMOS signal logic circuit is connected to power supply VDD and second power supply P2 of which potential is lower than ground potential, and is operative to output control voltage to the gate of the MOS transistor for controlling current in stand-by state. The CMOS signal logic circuit is caused to be of a structure adapted for outputting either potential VDD of the first power supply line P1 or voltage VSS1 of the second power supply line P2 by the control input terminal SIG.

In addition, the CMOS signal logic circuit may be connected to third power supply P3 having voltage VDD1 higher than power supply voltage VDD and ground potential terminal GND to output control voltage to the gate of the MOS transistor for controlling current in the stand-by state. In this case, the CMOS signal logic circuit is caused to be of a structure to output either potential VDD1 of the third power supply line P3 or ground potential GND by the control input terminal SIG.

(9) Thirteenth Embodiment

The circuit configuration of a semiconductor integrated circuit device of a thirteenth embodiment according to this invention is shown in FIG. 16.

This embodiment is characterized in that, in the semiconductor integrated circuit devices of the second, sixth and tenth embodiments, second P-channel MOS transistor MP4 is added between the drain of the P-channel MOS transistor MP3 and the first node N1 so that any excessive voltage which may become problem in reliability is not applied across gate and drain of the P-channel MOS transistor MP3.

As shown in FIG. 16, the semiconductor integrated circuit device of this embodiment includes a CMOS logic circuit CM, and P-channel MOS transistors MP3 and MP4 for controlling current in the stand-by state.

The CMOS logic circuit CM is of a structure in which the first node N1 is caused to be power supply line and the other end is connected to ground line G1. The threshold value of the transistors MP1, MN1, etc. constituting the CMOS logic circuit CM is set to value lower than the ordinary value.

The P-channel MOS transistor MP3 for controlling current in the stand-by state is of a structure in which the source is connected to the first power supply line P1. The P-channel transistor MP4 is of a structure in which its source is connected to drain of the the P-channel MOS transistor MP3 and the drain is connected to the first node N1. The threshold value of the P-channel MOS transistors MP3 and MP4 is set to lower value to the same degree as the threshold value of the transistors MP1, MN1, etc. constituting the CMOS logic circuit CM.

Moreover, control signal from the control input terminal SIG is inputted to the gate of the P-channel MOS transistor MP3. There is outputted, as a control signal, a signal such that low level indicates ground potential 0V and high level indicates voltage exceeding voltage on the first power supply line P1 in dependency upon high level and low level of signal applied to thereby carry out ON/OFF control of the P-channel MOS transistor MP3.

In this case, the voltage exceeding voltage on the first power supply line refers to such a voltage to allow the gate-source voltage VGS to be positive value so that is leakage current does not exceed the already fixed value resulting from the fact that the threshold value of the P-channel MOS transistor MP3 is lowered, i.e., a voltage such that voltage of high level is caused to be high in accordance with to what degree the threshold value of the P-channel MOS transistor MP3 is lowered.

On the other hand, control signal from the control input terminal SIG1 is inputted to the gate of the P-channel MOS transistor MP4. There is outputted, as a control signal, a signal in which low level indicates ground potential 0V and high level indicates voltage VDD of the first power supply line in dependency upon high level and low level of signal applied to thereby carry out ON/OFF control of the second P-channel MOS transistor MP4.

As an example of explanation of the operation, the CMOS logic circuit CM is assumed to be composed of, e.g., respective transistors of P-channel MOS transistor MP1 having threshold value of −0.2 V and N-channel MOS transistor MN1 having threshold value of 0.2 V. Moreover, the threshold value of P-channel MOS transistors MP3 and MP4 for reducing leakage current in the stand-by state is assumed to be, e.g., −0.2 V similarly to MOS transistors constituting the CMOS logic circuit CM. In addition, the power supply voltage VDD is assumed to be, e.g., 1 V in a direction where reliability becomes rigorous.

Further, at the time of operation of the CMOS logic circuit CM, low level 0V is applied to gates of the P-channel MOS transistors MP3 and MP4. Thus, voltage VDD of power supply terminal connected to the source of the P-channel MOS transistor MP3 becomes equal to 1V, and the gate-source voltages of the P-channel MOS transistors MP3 and MP4 become equal to 1V. Thus, the P-channel MOS transistors MP3 and MP4 having threshold value of −0.2 V are sufficiently turned ON, thus making it possible to carry out supply of current to the CMOS logic circuit CM.

On the other hand, at the time of stand-by state of the CMOS logic circuit CM, voltage higher than 1V which is the power supply voltage VDD, e.g., 1.5 V is applied as voltage of high level applied to the gate of the P-channel MOS transistor MP3, and 1V equal to the power supply voltage VDD is applied as voltage of high level applied to the gate of the P-channel MOS transistor MP4. Thus, the gate-source voltage VGS of the P-channel MOS transistor MP3 becomes equal to 0.5 V, and difference between the gate-source voltage and the threshold value becomes equal to 0.7 V. Since this difference is similar to the prior art, leakage current can be suppressed to the same degree as the prior art.

In this instance, since drain currents flowing in the P-channel MOS transistors MP3 and MP4 are equal to each other, potential of the drain of the P-channel MOS transistor MP3 is determined so that it becomes equal to a voltage where gate-source voltages VGS of the P-channel MOS transistors MP3 and MP4 are substantially equal to each other. As a result, such difference is only lowered down to about 0.5 V. Thus, voltage across gate and drain of the P-channel MOS transistor MP3 becomes equal to 1V at the maximum. In this case, the power supply -voltage VDD is assumed to be 1V in the second, sixth and tenth embodiments, and comparison therebetween is conducted. Since the drain voltage of the P-channel MOS transistor MP3 is lowered down to voltage substantially equal to voltage (potential) of the ground line G1, the voltage across the gate and the drain of the P-channel MOS transistor MP3 becomes equal to 1.5 V at the maximum. Thus, since the fact that the circuit is constituted as in the eleventh embodiment permits the circuit to be used in the state where excessive voltage is not applied to any portion thereof, such a circuit configuration is extremely effective for improvement in the reliability. This invention particularly exhibits conspicuous effects/advantages in MOS transistors in which miniaturization of the semiconductor integrated circuit devices has been developed and withstand voltage has a tendency to be lowered.

It is to be noted that the level conversion circuit or the CMOS signal logic circuit may be suitably provided similarly to the above-described second and tenth embodiments, thereby making it possible to deliver control signal to the control input terminal SIG. In addition, in this instance, control input signal SIG1 may be control input of such level conversion circuit or CMOS signal logic circuit.

(10) Fourteenth Embodiment

Figure 17:
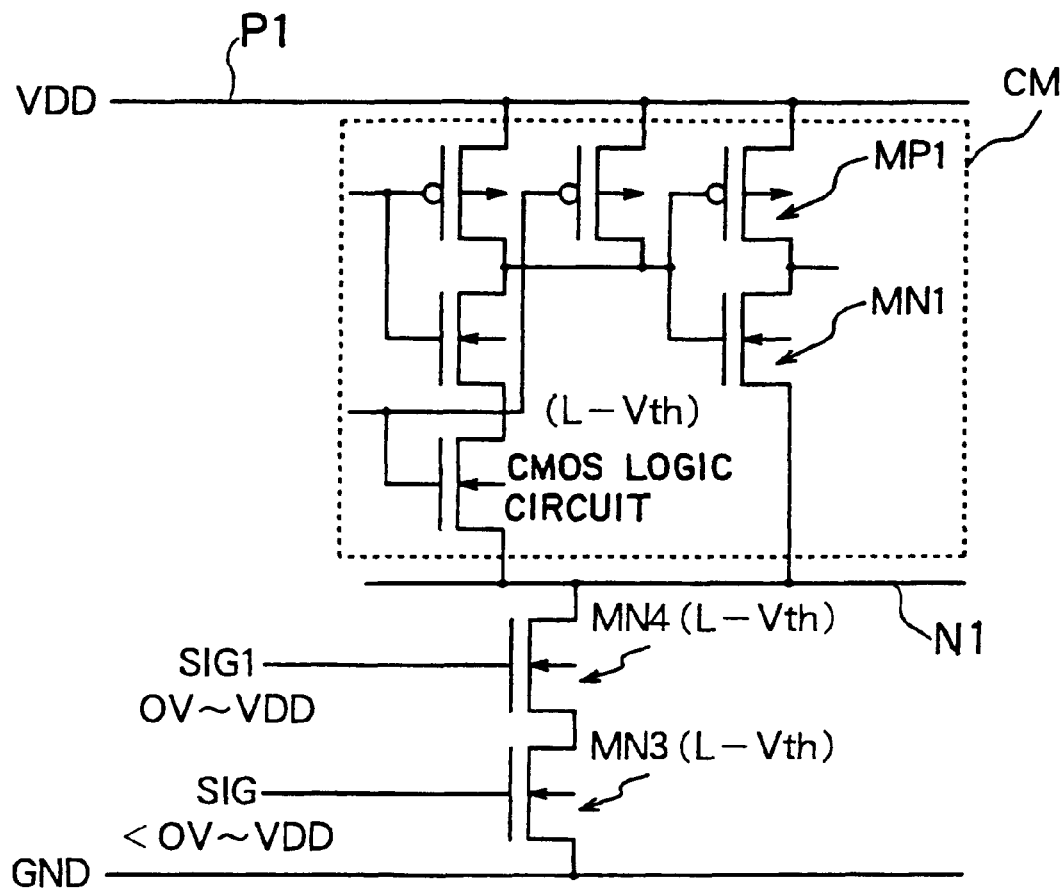
FIG. 17 is a view showing the circuit configuration of a semiconductor integrated circuit device of a fourteenth embodiment according to this invention.

The circuit configuration of a semiconductor integrated circuit device of a fourteenth embodiment according to this invention is shown in FIG. 17.

This embodiment is characterized in that, in the semiconductor integrated circuit devices of the fourth, eighth and twelfth embodiments, second N-channel MOS transistor MN4 is added between the drain of the N-channel MOS transistor MN3 and the first node N1, whereby such an excessive voltage which may become problem in reliability is not applied across the gate and the drain of the N-channel MOS transistor MN3.

As shown in FIG. 17, the semiconductor integrated circuit device of this invention includes a CMOS logic circuit CM, and N-channel MOS transistors MN3 and MN4 for controlling current in the stand-by state.

The CMOS logic circuit CM is of a structure in which the first power supply line P1 is caused to be power supply line and the other end is connected to the first node N1. The threshold value of transistors MP1, MN1, etc. constituting the CMOS logic circuit CM is set to value lower than ordinary value.

The N-channel MOS transistor MN3 for controlling current in the stand-by state is of a structure in which the source is connected to ground line G1. The N-channel MOS transistor MN4 is of a structure in which its source is connected to the drain of the N-channel MOS transistor MN3, and its drain is connected to the first node N1. The threshold value of the N-channel MOS transistors MN3 and MN4 is set to lower value to the same degree as the threshold value of the transistors MP1, MN1, etc. constituting the CMOS logic circuit CM.

Moreover, the control input terminal SIG is connected to the gate of the N-channel MOS transistor MN3 to apply control signal thereto. Thus, a signal in which low level indicates negative voltage and high level indicates the same potential as that of the first power supply line P1 in dependency upon high level and low level of signal applied to the control input terminal SIG is outputted to thereby carry out ON/OFF control of the N-channel MOS transistor MN3.

In this case, negative voltage refers to a voltage in which gate-source voltage VGS is caused to be negative value so that leakage current is not above the already fixed value resulting from the fact that the threshold value of the N-channel MOS transistor MN3 is lowered and is defined as negative value in dependency upon to what degree the threshold value is lowered.

On the other hand, the control input terminal SIG1 is connected to the gate of the N-channel MOS transistor MN4 to apply control signal thereto. Thus, a signal in which low level indicates 0V and high level indicates the same potential as that of the first power supply line P1 in dependency upon high level and low level of signal applied to the control input terminal SIG is outputted to thereby carry out ON/OFF control of the second N-channel MOS transistor MN4.

As an example of explanation of the operation, the CMOS logic circuit CM is assumed to be composed of, e.g., respective transistors of P-channel MOS transistor MP1 having threshold value of −0.2 V and N-channel MOS transistor MN1 having threshold value of 0.2 V. Moreover, the threshold value of the N-channel MOS transistors MN3 and MN4 for reducing leakage current in the stand-by state is caused to be, e.g., −0.2 V similarly to the MOS transistors constituting the CMOS logic circuit CM. Further, the power supply voltage VDD is assumed to be, e.g., 1V in a direction where reliability becomes rigorous.

Further, at the time of operation of the CMOS logic circuit CM, 1V of high level is applied to the gates of the N-channel MOS transistors MN3 and MN4. Thus, the ground line connected to the source of the N-channel MOS transistor MN3 becomes equal to 0V, and the gate-source voltages of the N-channel MOS transistors MN3 and MN4 become equal to 1V. As a result, the N-channel MOS transistors MN3 and MN4 having threshold value of 0.2 V are sufficiently turned ON, thus making it possible to carry out supply of current to the CMOS logic circuit CM.

On the other hand, at the time of stand-by state of the CMOS logic circuit CM, voltage lower than 0V of voltage of the ground line G1, e.g., −0.5 V is applied as voltage of low level applied to the gate of the N-channel MOS transistor MN3, and 0V equal to voltage of the ground line G1 is applied as voltage of low level applied to the gate of the N-channel MOS transistor MN4. Thus, the gate-source voltage VGS of the N-channel MOS transistor MN3 becomes equal to −0.5 V and difference between the gate-source voltage and the threshold value becomes equal to −0.7 V. Since this difference is similar to that of the prior art, the leakage current can be suppressed to the same degree as that of the prior art.

In this instance, since drain currents flowing in the N-channel MOS transistors MN3 and MN4 are equal to each other, potential of the drain of the N-channel MOS transistor MN3 is determined so that it becomes equal to a voltage where gate-source voltages VGS of the N-channel MOS transistors MN3 and MN4 are substantially equal to each other. As a result, such potential is only raised to about 0.5 V. Thus, voltage across the gate and the drain of the N-channel MOS transistor MN3 becomes equal to 1V at the maxiumum. In this case, in the fourth, eighth and twelfth embodiments, the power supply voltage VDD is assumed to be 1V. When comparison therebetween is carried out, the drain voltage of the N-channel MOS transistor MN3 is lowered down to voltage substantially equal to voltage (potential) of the ground line G1. For this reason, voltage across the gate and the drain of the N-channel MOS transistor MN3 becomes equal to 1.5 V at the maximum. Thus, since employment of the configuration as in the fourteenth embodiment permits the circuit to be used in the state where excessive voltage is not applied to any portion thereof, this circuit configuration is extremely advantageous to improvement in reliability. This invention has conspicuous effects/advantages in MOS transistors in which miniaturization of the semiconductor integrated circuit devices has been developed and withstand voltage has a tendency to be lowered.

It is to be noted that level conversion circuit or CMOS signal logic circuit may be suitably provided similarly to the above-described fourth and twelfth embodiments, thereby making it possible to deliver control signal to the control input terminal SIG. In addition, in this instance, control input signal SIG1 may be control input of such level conversion circuit or CMOS signal logic circuit.

(11) Level Conversion Circuit

Figure 18:
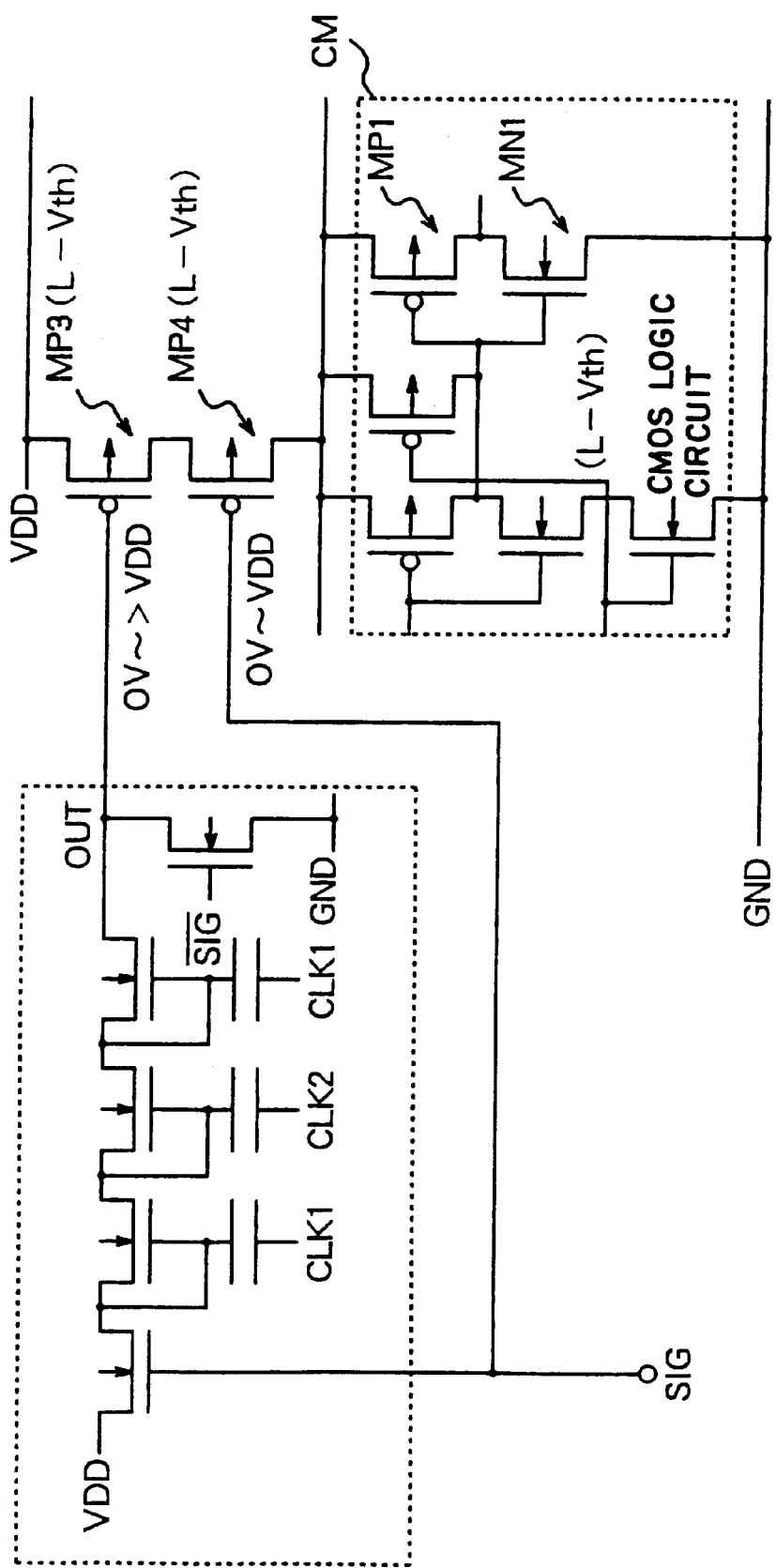
FIG. 18 is a circuit diagram of level conversion circuit (3).

An example of the circuit configuration of level conversion circuit (3) is shown in FIG. 18. This level conversion circuit can be used in the thirteenth embodiment of this invention.

Figure 6B:
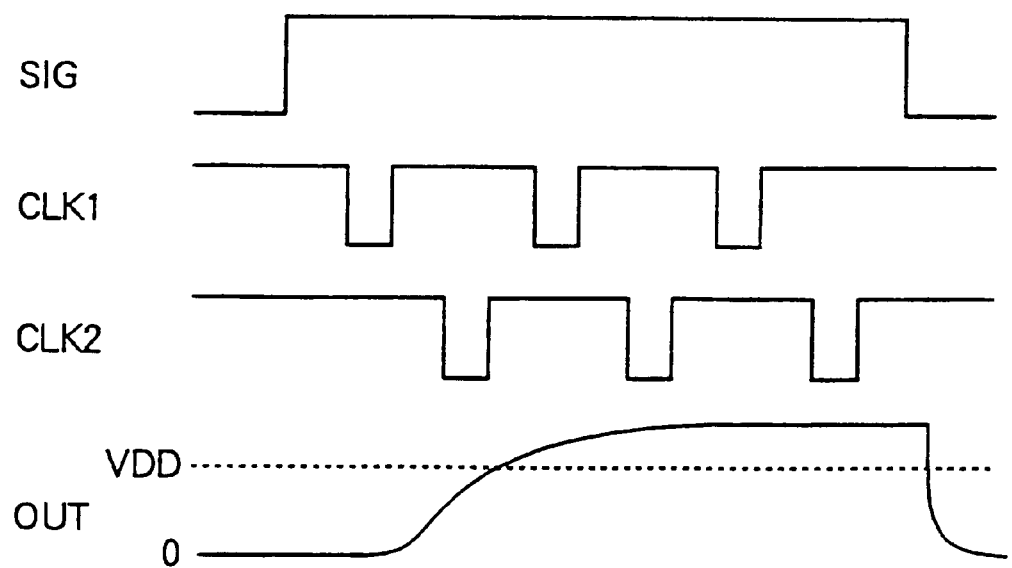
FIG. 6B is a timing chart showing the operation of the level conversion circuit (2).

The circuit shown in FIG. 18 is a typical charge pump circuit similarly to the circuit shown in FIG. 6, and is composed of plural N-channel MOS transistors and capacitors, etc. The number of stages of the charge pumps may be suitably set as occasion demands, thereby making it possible to adjust output signal OUT.

0~VDD are applied to the gate of the P-channel MOS transistor MP4 on the basis of control input signal SIG. Moreover, output OUT of the level conversion circuit (3) (voltage above 0~VDD) is applied to the gate of the P-channel MOS transistor MP3 on the basis of inputted control input signal SIG.

Also in the fourteenth embodiment of this invention, level conversion circuit may be similarly constituted by the circuit shown in FIG. 5, etc. to combine it with that circuit configuration.

(12) CMOS Signal Logic Circuit

Figure 19:
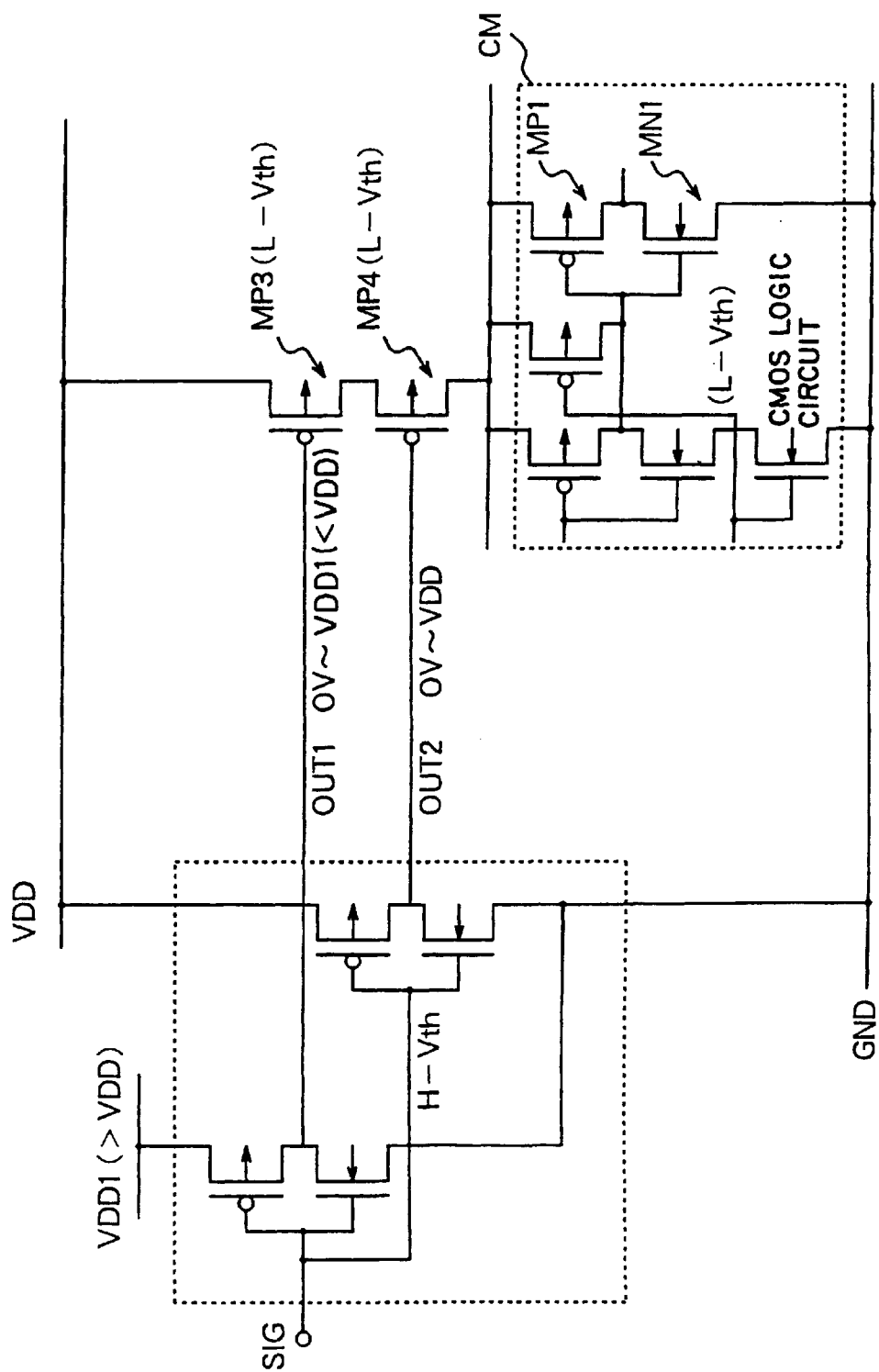
FIG. 19 is a view showing the circuit configuration of CMOS signal logic circuit.
Figure 20:
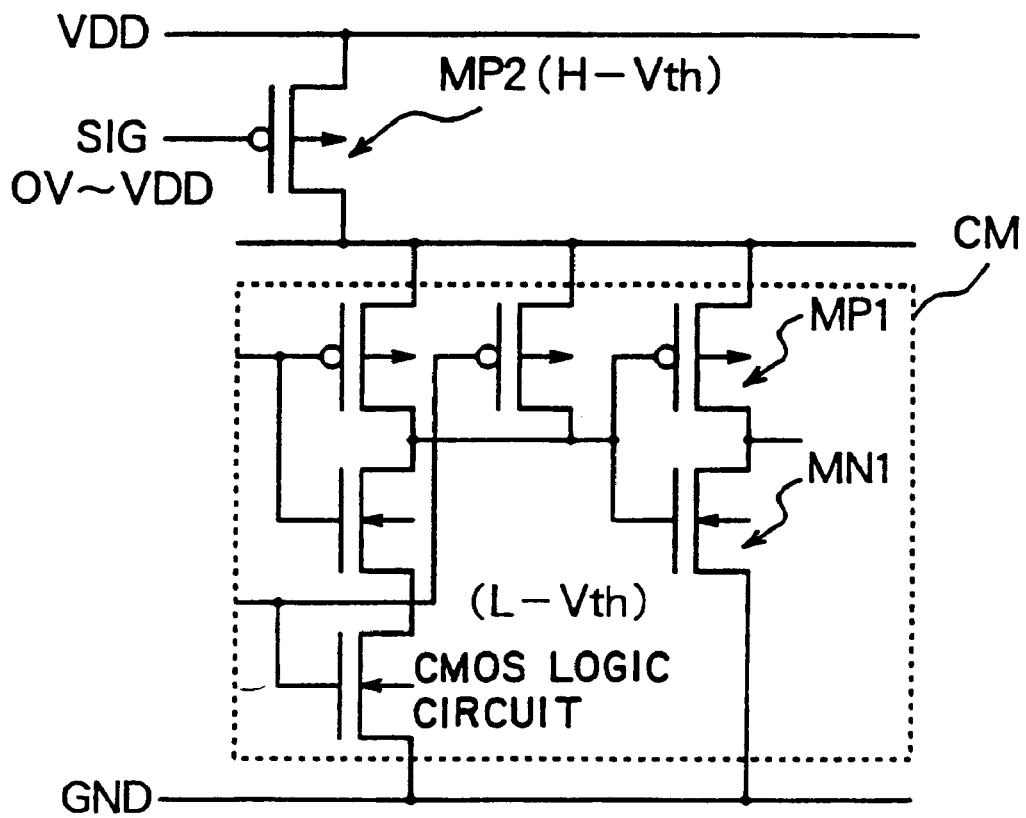
FIG. 20 is a view showing the circuit configuration of a conventional MT-CMOS circuit.

An example of the circuit configuration of CMOS signal logic circuit (2) is shown in FIG. 19.

This CMOS signal logic circuit (2) can be used in the thirteenth embodiment of this invention.

The CMOS signal logic circuit is connected to power supply terminal VDD and power supply terminal VDD1 having voltage higher than the power supply VDD to output control voltages OUT1 and OUT2 to gates of the MOS transistors MP3 and MP4 for controlling stand-by current. By the control input terminal SIG, when signal (control input) is at low level, 0V is outputted to outputs OUT1 and OUT2, while when signal (control input) is at high level, VDD1 (>VDD) is outputted to the output OUT1, and VDD is outputted to output OUT2.

Also in the fourteenth embodiment of this invention, any suitable CMOS signal logic circuit may be constituted with reference to FIG. 15 to combine it with that circuit configuration.

What is claimed is:

1. A semiconducter integrated circuit device comprising:
   a first logic circuit comprised of MOS transistors having a first threshold voltage lower than a potential of a first power supply line; and
   a P-channel MOS transistor having a second threshold value, an absolute value of the second threshold value being larger than an absolute value of the first threshold voltage,
   wherein a first node connected to a virtual power supply line of the first logic circuit is connected to a drain of the P-channel MOS transistor, and wherein the first power supply line is connected to a source of the P-channel MOS transistor, and a signal in which low level indicates a voltage lower than a potential of the ground line and high level indicates a voltage equal to the potential of the first power supply line is applied to the gate of the P-channel MOS transistor, whereby the P-channel MOS transistor is caused to undergo ON/OFF control.

2. A semiconductor integrated circuit device as set forth in claim 1,
   which further comprises a first level conversion circuit for outputting, to the gate of the P-channel MOS transistor, a signal in which low level indicates a voltage lower than potential of the ground line and high level indicates a voltage equal to potential of the first power supply line.

3. The semiconductor integrated circuit device as set forth in claim 1,
   which further comprises a second logic circuit supplied with power from the first power supply line as the positive power line and a second power supply line as the negative power line, wherein a potential of the second power line is lower than the potential of the ground line, and an output of the second logic circuit is connected to the gate of the P-channel MOS transistor, and wherein the low level of the output signal of the second logic circuit is equal to the potential of the second power supply line and the high level thereof is equal to the potential of the first power supply line, and comprised of a MOS transistor having a third threshold voltage, an absolute value of the third threshold voltage being larger than an absolute value of the first threshold voltage.

* * * * *